United States Patent
Lee et al.

(10) Patent No.: US 11,874,471 B2
(45) Date of Patent: Jan. 16, 2024

(54) ELECTRONIC DEVICE INCLUDING HEAT RADIATING MEMBER

(71) Applicant: Samsung Electronics Co., Ltd., Gyeonggi-do (KR)

(72) Inventors: Jungkeun Lee, Gyeonggi-do (KR); Youngho Yoon, Gyeonggi-do (KR); Kyeongsoo Kim, Gyeonggi-do (KR); Hyunmo Yang, Gyeonggi-do (KR); Younsang Yoo, Gyeonggi-do (KR); Haejin Lee, Gyeonggi-do (KR); Sangchul Jung, Gyeonggi-do (KR); Seungnyun Kim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 140 days.

(21) Appl. No.: 17/533,209

(22) Filed: Nov. 23, 2021

(65) Prior Publication Data
US 2022/0163809 A1    May 26, 2022

Related U.S. Application Data

(63) Continuation of application No. PCT/KR2021/017294, filed on Nov. 23, 2021.

(30) Foreign Application Priority Data

Nov. 23, 2020 (KR) .......................... 10-2020-0158104

(51) Int. Cl.
| | |
|---|---|
| G02B 27/01 | (2006.01) |
| G02B 6/10 | (2006.01) |
| H05K 7/20 | (2006.01) |

(52) U.S. Cl.
CPC ..... *G02B 27/0176* (2013.01); *H05K 7/20154* (2013.01)

(58) Field of Classification Search
CPC .................... G02B 27/0176; H05K 7/20154
See application file for complete search history.

(56) References Cited

U.S. PATENT DOCUMENTS

| | | |
|---|---|---|
| 10,579,111 B1 | 3/2020 | Jenkins et al. |
| 10,620,439 B1 | 4/2020 | Zhang |
| | (Continued) | |

FOREIGN PATENT DOCUMENTS

| | | | |
|---|---|---|---|
| CN | 209198767 U | 8/2019 | |
| JP | 2013054076 B2 * | 8/2011 | ......... G02B 27/0176 |
| | (Continued) | | |

OTHER PUBLICATIONS

International Search Report dated Mar. 2, 2022.

*Primary Examiner* — Kwang-Su Yang
(74) *Attorney, Agent, or Firm* — Cha & Reiter, LLC

(57) ABSTRACT

A wearable electronic device is disclosed, including: a housing including a first surface facing a same direction as a gaze of a user, a second surface facing in a second direction towards a face of the user, and a side surface surrounding a space defined between the two surfaces, a first and second light output device disposed in the housing and configured to output an image, a printed circuit board at least partially disposed between the first and second light output device, and including at least one electronic component, a supportive frame, a battery disposed between the frame and the second surface, and a first heat radiating member disposed between the frame and the battery.

15 Claims, 10 Drawing Sheets

(56) References Cited

U.S. PATENT DOCUMENTS

| | | |
|---|---|---|
| 2015/0275061 A1 | 10/2015 | Jeon et al. |
| 2016/0212879 A1* | 7/2016 | Nikkhoo ............ H05K 7/20454 |
| 2016/0212886 A1 | 7/2016 | Nikkhoo |
| 2016/0255748 A1 | 9/2016 | Kim et al. |
| 2018/0003987 A1 | 1/2018 | Otsubo et al. |
| 2018/0307282 A1 | 10/2018 | Allin et al. |
| 2019/0317331 A1* | 10/2019 | Nam .................. G02B 27/0176 |
| 2020/0073125 A1 | 3/2020 | Kimura et al. |
| 2020/0110449 A1 | 4/2020 | Chang et al. |
| 2020/0128672 A1* | 4/2020 | Silha .................... H02J 7/0045 |
| 2020/0379257 A1* | 12/2020 | Lee .................... H05K 7/20963 |
| 2022/0299777 A1* | 9/2022 | Zhang ................ G02B 27/0172 |

FOREIGN PATENT DOCUMENTS

| | | | |
|---|---|---|---|
| JP | 2013-54076 A | 3/2013 | |
| JP | 2018-7050 A | 1/2018 | |
| JP | 2018-182553 A | 11/2018 | |
| JP | 2019-4420 A | 1/2019 | |
| JP | 2020-36260 A | 3/2020 | |
| KR | 10-2014-0043031 A | 4/2014 | |
| KR | 10-2016-0105228 A | 9/2016 | |
| KR | 10-1842387 B1 | 3/2018 | |
| WO | 2020/171246 A1 | 8/2020 | |
| WO | WO-2020171246 A1 * | 8/2020 | ............. G02B 27/01 |

\* cited by examiner

ELECTRONIC DEVICE INCLUDING HEAT RADIATING MEMBER

CROSS-REFERENCE TO RELATED APPLICATION(S)

This application is a continuation application, claiming the benefit priority under § 365(c), of an International application No. PCT/KR2021/017294, filed on Nov. 23, 2021, which is based on and claims the benefit of a Korean patent application number 10-2020-0158104, filed on Nov. 23, 2020, in the Korean Intellectual Property Office, the disclosure of each of which is incorporated by reference herein in its entirety.

TECHNICAL FIELD

Certain embodiments of the disclosure relate to electronic devices, e.g., wearable electronic devices, that may be worn on a part of the body, such as head-mounted devices (HMDs).

BACKGROUND ART

Portable electronic devices, such as electronic schedulers, portable multimedia players, mobile communication terminals, tablet personal computers (PCs), etc., are generally equipped with a display member and a battery, and may be limited in shape to a bar, clamshell, or slidable-type shapes by their accompanying displays or batteries. With display members and batteries becoming smaller or more compact, some electronic devices have been designed that are wearable on the user's wrist, head, or other body portions. For example, a head-mounted device (HUD), smart glasses, a smart watch (or band), a contact lens-type device, a ring-type device, a glove-type device, a shoe-type device, or a clothing-type device may be worn on the user's body. These wearable electronic devices are easy to carry and may enhance user accessibility.

DETAILED DESCRIPTION

With head-mounted devices such as virtual reality (VR) or augmented reality (AR) glasses, a display member may be implemented as to include a dual lens frame (e.g., via a frame shaped to resemble glasses). The head-mounted device may thus output virtual objects for viewing through the display member.

To output display of the virtual objects, the head-mounted device may further include a light output device that displays virtual objects on the display member. The light output device may include, for example, a projector. Light emitted from the light output device forms an image on and/or through the display member. The user may receive visual information for the virtual object via the image formed via the display member.

To increase the clarity of visual information for display, the light output device may emit high-power light. Thus, the head-mounted device may be required to have a means to radiate the heat generated from operation of the light output device. For example, if the light output device is formed in a face-mounting part of the head-mounted device that couples to a user's face, the heat generated from the light output device radiate to the user's eyes, temples, and forehead, causing discomfort.

To give a heat radiation functionality to the head-mounted device, a heat radiating plate may be disposed near the light output device according to certain embodiments. In such a case, heat radiation occurs mostly wherever the light output device is disposed and thus, the efficiency of heat radiation efficiency may be poor. As the head-mounted device uses integrated high-performance components, a significant amount of heat may be generated from an interior of the head-mounted device, affecting adjacent components and degrading the overall performance of the electronic device.

If a battery is disposed in the face-mounting part of the head-mounted device, the heat generated from the electronic device may be transmitted to the battery, reducing the performance of the battery, and/or increasing the temperature of the battery, and thereby causing more discomfort to the user.

According to certain embodiments of the disclosure, there may be provided a head-mounted device capable of effectively radiate the heat generated from a heat source.

According to certain embodiments of the disclosure, it is possible to reduce the volume of the head-mounted device by efficiently using the mounting space.

The disclosure is not limited to the foregoing embodiments but various modifications or changes may rather be made thereto without departing from the disclosure.

According to certain embodiments of the disclosure, an electronic device includes: a housing including a first surface facing a first direction corresponding to a gaze of a user when wearing the electronic device, a second surface facing in a second direction opposite to the first direction and oriented towards a face of the user, and a side surface surrounding a space defined between the first surface and the second surface, a first light output device and a second light output device disposed in the housing and configured to output an image, a printed circuit board at least partially disposed between the first light output device and the second light output device, and including at least one electronic component, a frame supporting at least one of the first light output device, the second light output device, and the printed circuit board, a battery disposed between the frame and the second surface, and a first heat radiating member disposed between the frame and the battery.

According to certain embodiments of the disclosure, an electronic device includes: a housing including a first surface facing a first direction corresponding to a gaze of a user when wearing the electronic device, a second surface facing a second direction opposite to the first direction and oriented towards a face of the user, and a side surface surrounding a space between the first surface and the second surface, a first light output device and a second light output device disposed in the housing and configured to output an image, a printed circuit board at least partially disposed between the first light output device and the second light output device, and including at least one electronic component, a frame supporting at least one of the first light output device, the second light output device, and the printed circuit board, a pair of batteries disposed to be inclined with respect to the frame between the frame and the second surface, a pair of first heat radiating members disposed between the frame and the batteries, and a second heat radiating member disposed adjacent to the frame in a third direction perpendicular to the first direction and the second direction.

According to certain embodiments of the disclosure, in a head-mounted device, the printed circuit board may be disposed between the light output devices, reducing the volume of the head-mounted device.

According to certain embodiments of the disclosure, the head-mounted device may effectively disperse the heat generated from a heat generation source using a frame receiving the heat generated from electronic components (e.g., the processor and the light output device).

According to certain embodiments of the disclosure, in the head-mounted device, a battery is disposed a predetermined distance away from the battery in the face-mounting part, and the heat radiating structure is disposed in the resultant open space. Thus, it is possible to more efficiently utilize available mounting space.

As such, according to certain embodiments of the disclosure, the head-mounted device includes a heat radiating structure capable of efficiently transferring, dispersing, and radiating heat generated in the face-mounting part. The face mounting part may include a through hole, through which air flows around the heat radiating structure thereby increasing heat radiation efficiency by friction between the heat radiating structure and the air flow.

DETAILED DESCRIPTION

Figure 1:
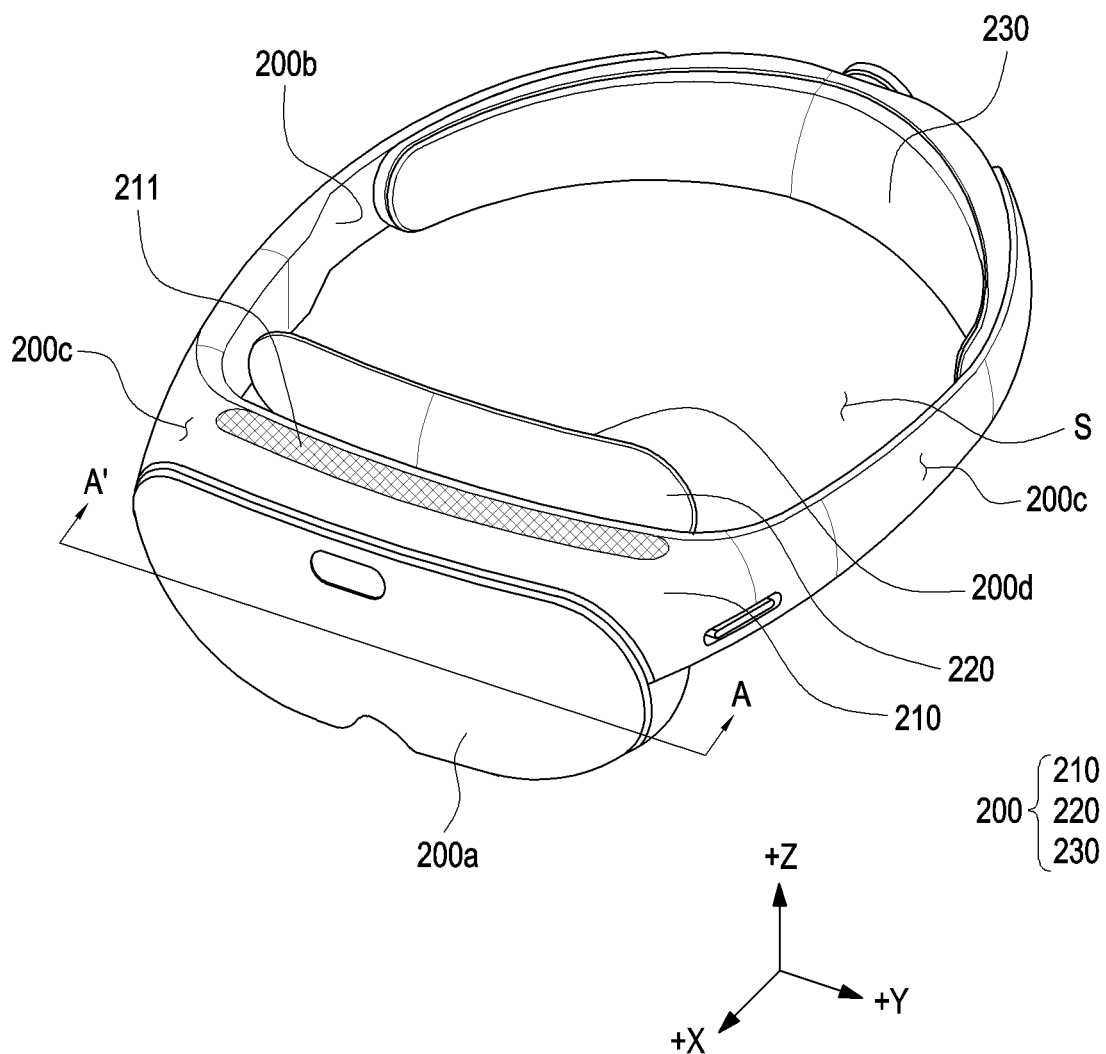
FIG. 1 is a perspective view illustrating an example electronic device according to certain embodiments of the disclosure.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the above-listed embodiments.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to certain embodiments, each component (e.g., a module or a program) of the above-described components may include a single entity or multiple entities. Some of the plurality of entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

FIG. 1 is a perspective view illustrating an electronic device according to certain embodiments of the disclosure.

According to certain embodiments of the disclosure, in the drawings including FIG. 1, the direction components +X, +Y, and +Z may refer to coordinate axes orthogonal to each other. In the following description, the A-A' axis may be parallel to the direction component +Y. Although not illustrated in the drawings, the direction component −X may mean a direction component facing in a direction opposite to the direction component +X, and the direction component −Y may mean a direction component facing in a direction opposite to the direction component +Y. The direction component −Z may mean a direction component facing in a direction opposite to the direction component +Z. In certain embodiments of the disclosure, the direction component +X or −X may mean a direction component in the width direction of the electronic device 101. In certain embodiments of the disclosure, the direction component +Y or −Y may mean a direction component in the length direction of the electronic device 101. In certain embodiments of the disclosure, the direction component +Z or −Z may mean a direction component in the height direction of the electronic device 101. When a first component is disposed on a 'back surface' or 'rear surface' of a second component (e.g., a frame is disposed on a rear surface of a printed circuit board), the first component and the second component may be disposed in the width direction of the electronic device 101. However, it should be noted that the direction components described and illustrated in certain embodiments and drawings of the present disclosure are provided for the convenience of description and do not limit the scope of the claims and order.

According to certain embodiments of the disclosure, the electronic device 101 may be a wearable device which may be coupled to a user's body. For example, the electronic device 101 may be a head-mounted device (HMD) capable of outputting a variety of imagery to the user's eyes while the user is wearing the electronic device.

Referring to FIG. 1, the electronic device 101 may include a housing 200 that forms the exterior of the electronic device 101. According to certain embodiments, the housing 200 may form the exterior of the electronic device 101 and provide an interior space in which components of the electronic device 101 may be disposed. According to an embodiment, the housing 200 may include a face-wearing part 210 that surrounds at least a portion of the user's head.

According to an embodiment, the face-wearing part 210 may include a first surface 200*a* oriented as to face an exterior of the electronic device 101, and a second surface 200*b* at least partially oriented towards the user's face. According to an embodiment, a direction in which the first surface 200*a* faces may be referred to as a first direction, and a direction in which the second surface 200*b* faces may be referred to as a second direction. The first surface 200*a* and the second surface 200*b* may include a curved surface. It is understood that the first direction and the second direction are not limited in meaning to any specific direction, but rather may be set as any of various directions relative to the curved surface.

According to an embodiment, at least a portion of the second surface 200*b* may be disposed opposite to the first surface 200*b* with respect to the component (e.g., the light output device 310 of FIG. 3) of the electronic device 101. For example, the second surface 200*b* may surround at least a portion of the user's face. As another example, the face-wearing part 210 may include a nose rest (not shown) configured to rest on the user's nose. According to an embodiment, the second surface 200*b* may define a space "S" into which the user's head fits.

According to certain embodiments, the face-wearing part 210 may include a side surface 200*c* that surrounds at least a portion between the first surface 200*a* and the second surface 200*b* and faces the exterior of the electronic device 101. The side surface 200*c* may include several curved portions except for the first surface 200*a* and the second surface 200*b* of the housing 200 of the electronic device 101.

According to certain embodiments, the housing 200 may include a first supporting part 220 that may be seated on the user's forehead. According to an embodiment, the first supporting part 220 may include a third surface 200*d* oriented as to face the user's forehead. According to an embodiment, the first supporting part 220 may be disposed on at least a portion of the second surface 200*b*.

According to certain embodiments, the housing 200 may include a second supporting part 230 that may be seated on the back of the user's head. According to an embodiment, at least a portion of the second supporting part 230 may be disposed on the second surface 200*b* of the face-wearing part 210.

Figure 2:
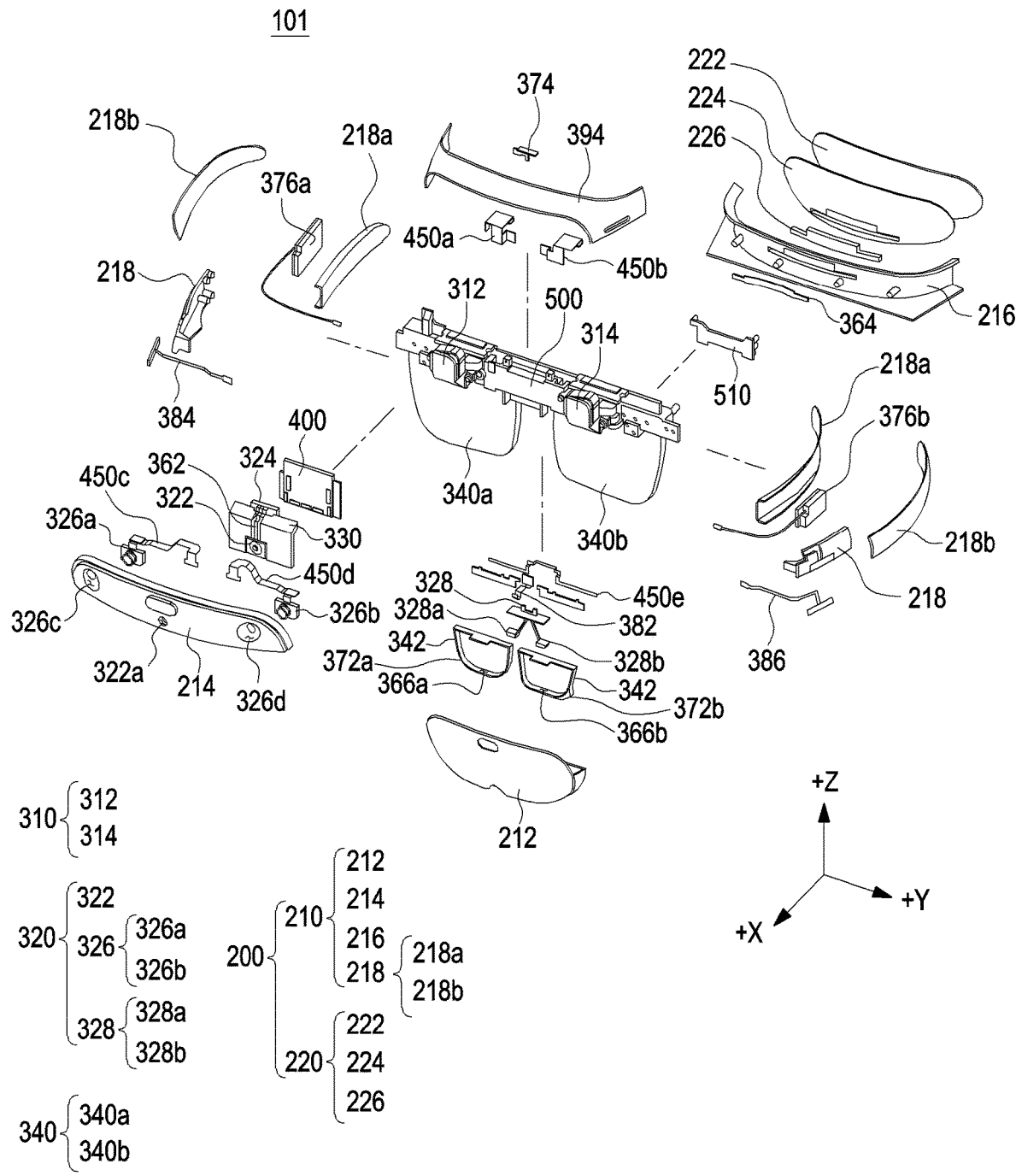
FIG. 2 is an exploded perspective view illustrating an example electronic device according to certain embodiments of the disclosure.

FIG. 2 is an exploded perspective view illustrating an electronic device according to certain embodiments of the disclosure.

Referring to FIG. 2, an electronic device 101 may include a face-mounting part 210, a first supporting part 220, a light output device 310, a camera module 320, an antenna module 330, a glass member 340, and a frame 500. The configuration of the electronic device 101, the face-mounting part 210, and the first supporting part 220 of FIG. 2 may be identical in whole or part to the configuration of the electronic device 101, the face-mounting part 210, and the first supporting part 220 of FIG. 1.

According to certain embodiments, the face-mounting part 210 may include a window member 212, a first supporting member 214, a second supporting member 216, and side members 218 surrounding at least a portion between the first supporting member 214 and the second supporting member 216. According to an embodiment, the first supporting member 214 may be disposed behind the window member 212 in a rearwards-oriented direction (e.g., a −X direction). According to an embodiment, the side members 218 may include a first side member 218*a* forming a side surface (e.g., the side surface 200*c* in FIG. 1) of the electronic device 101 and a second side surface 218*b* facing a second surface (e.g., the second surface 200*b* of FIG. 1) of the electronic device 101.

According to an embodiment, the face-mounting part 210 may include a window member 212 forming a first surface (e.g., the first surface 200*a* of FIG. 1). In some embodiments, the window member 212 may be substantially transparent, so that an external environment may be visible to the user wearing the electronic device 101 through the window member 212. However, without being limited thereto, the window member 212 may alternatively be omitted from the face-mounting part 210.

According to certain embodiments, the first supporting part 220 may include a cushion member 222 configured to be seated on the user's forehead. According to certain embodiments, the first supporting part 220 may be coupled with the face-mounting part 210. For example, the first supporting part 220 may include a first connection member 226 coupled with the second supporting member 216 of the face-mounting part 210, a cushion member frame 224 connected with the first connection member 226, and a cushion member 222 disposed on the cushion member frame 224.

According to certain embodiments, the light output device 310 may output images to the user. For example, a light output device may include a display panel (not shown) capable of outputting images, and a lens (not shown) aligned to the user's eye, and guiding images to the glass member 340. According to certain embodiments, the light output device 310 may be disposed in the housing 200. For example, the light output device 310 may include a first light output device 312 configured to correspond to the user's right eye and a second light output device 314 configured to correspond to the user's left eye. According to an embodiment, the user's right eye may receive the image output from the display panel of the first light output device 312 through the lens of the first light output device 312, and the user's left eye may receive the image output from the display panel of the second light output device 314 through the lens of the second light output device 314.

According to certain embodiments, the lens may include a first lens for guiding the image output from the display panel of the first light output device 312 to the first glass member 340a and a second lens for guiding the image output from the display panel of the second light output device 314 to the second glass member 340b. For example, the first lens and the second lens may be condenser lenses. According to an embodiment, other optical elements may be disposed between the first lens and the first glass member 340a or between the second lens and the second glass member 340b to set a travel path of the light or image from the first lens to the first glass member 340a and/or a travel path of the light of image from the second lens to the second glass member 340b. The first image or the second image passing through the first lens or the second lens may be transmitted to the glass member 340 through an input port (not shown) disposed in one area of the glass member 340.

According to certain embodiments, the electronic device 101 may include a camera module 320 capable of capturing still images and videos. The camera module 320 may include at least one of a lens, at least one image sensor, an image signal processor, or a flash. The camera module 322, 326, and 328 may include at least one of a first camera module 322, a second camera module 326, and a third camera module 328. According to an embodiment, the first camera module 322 may capture an external image through a first camera hole 322a of the first supporting member 214. According to an embodiment, the second camera module 326 may include a 2-1st camera module 326a disposed in a second camera hole 326c of the first supporting member 214 and a 2-2nd camera module 326b disposed in a third camera hole 326d of the first supporting member 214. The second camera module 326 may be a gray scale camera. According to an embodiment, the third camera module 328 may capture the trajectory of the user's eye (e.g., the pupils). For example, the third camera module 328 may capture the reflection pattern of the light emitted by the light emitting unit 366a or 366b to the user's eye. The third camera module 328 may include a 3-1st camera module 328a capable of capturing the trajectory of the user's right eye and a 3-2nd camera module 328b capable of capturing the trajectory of the user's left eye.

According to certain embodiments, the antenna module 330 may transmit or receive a signal or power to or from the exterior (e.g., the external electronic device). According to an embodiment, a processor (e.g., the processor 440 of FIG. 3) of the electronic device 101 may communicate with an external electronic device, via a short-range communication network (e.g., Bluetooth, Bluetooth low energy (BLE), wireless fidelity (Wi-Fi) direct, or infrared data association (IrDA), using the antenna module 330. According to an embodiment, the antenna module 330 may include one antenna including a radiator formed of a conductor or conductive pattern formed on a substrate (e.g., a printed circuit board (PCB)). According to an embodiment, the antenna module 330 may include a plurality of antennas (e.g., an antenna array).

According to certain embodiments, the electronic device 101 may include a glass member 340 including a plurality of glasses. The glass member 340 may provide the user with at least one of an external image or an image output from the light output device 310.

According to certain embodiments, at least a portion of the glass member 340 may allow pass through of light from an external environment. For example, the user may perceive the external environment through the glass member 340 while wearing the electronic device 101.

According to certain embodiments, the glass member 340 may include a waveguide (not shown) providing a path of the light generated by the light output device 310. According to an embodiment, the glass member 340 may direct the image output from the light output device 310 to the user's eyes through the waveguide. For example, the waveguide may diffract, polarize, or reflect the image in directing the image to the user's eye. For example, the light generated by the light output device 310 may be reflected on a grating area of the glass member 340 and transmitted to the user's eyes. As another example, the waveguide may form a hologram based on an image output from the light output device 310. According to an embodiment, the waveguide may include at least one of a lens, a mirror, a prism, or a nanopattern-formed transparent member. The size of the image directed from the glass member 340 to the user's eye may be larger than the actual size of the image output from the light output device 310.

According to certain embodiments, the glass member 340 may provide the user with the image output from the light output device 310 and the image incident from the exterior of the electronic device 101 to the user.

According to certain embodiments, the light output device 310 may be disposed on at least a portion of the glass member 340. For example, the first light output device 312 may be disposed in the +Z direction of the first glass member 340a, and the second light output device 314 may be disposed in the +Z direction of the second glass member 340b. However, the arrangement of the output device 310 is not necessarily limited thereto. The light output device 310 may be disposed in the +Y or −Y direction of the glass member 340.

According to certain embodiments, at least a portion of the glass member 340 may be disposed in the frame 500. At least a portion of a side surface (e.g., the YZ plane) of the glass member 340 may be surrounded by at least one glass member enclosure 342. For example, each of the first glass member 340a and the second glass member 340b may be disposed in the glass member enclosure 342.

According to certain embodiments, the electronic device 101 may include at least one of a first microphone 372a, a second microphone 372b, or a third microphone 374 for recording and converting a sound into an electrical signal. According to an embodiment, each of the first microphone 372a and the second microphone 372b may be disposed in the glass member enclosure 342, and the third microphone 374 is disposed in the upper direction of the glass member 340 (e.g., an upper portion of the frame 500).

According to certain embodiments, the electronic device 101 may include a first light emitting unit 362, a second light emitting unit 364, a 3-1st light emitting unit 366a, or a 3-2nd light emitting unit 366b capable of emitting light to the exterior of the electronic device 101. According to an embodiment, the first light emitting unit 362 and the second light emitting unit 364 may include light emitting diodes (LEDs) configured to emit light in a visible ray band. According to an embodiment, the 3-1st light emitting unit 366a and the 3-2nd light emitting unit 366b may include light emitting diodes configured to emit light in an infrared band. At least one of the 3-1st light emitting unit 366a or the 3-2nd light emitting unit 366b may emit light in an infrared band to the user (e.g., the user's eyes). For example, the 3-1st light emitting unit 366a and/or the 3-2nd light emitting unit 366b may emit an infrared band of light towards the user's eyes to allow the third camera module 328 to capture the trajectory of the user's eyes (e.g., an orientation in which the pupils are facing).

According to certain embodiments, the electronic device 101 may include a first speaker 376a or a second speaker 376b capable of converting an electrical signal into sound. According to an embodiment, the first speaker 376a may be disposed on the side member 218 to correspond to the user's right ear, and the second speaker 376b may be disposed on the side member 218 to correspond to the user's left ear.

According to certain embodiments, the electronic device 101 may include a sensor module (not shown). The sensor module may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module may include, for example, a gesture sensor, a gyro sensor, an atmospheric pressure sensor, a magnetic sensor, an acceleration sensor, a grip sensor, a proximity sensor 382, a color sensor, an infrared (IR) sensor, a biometric sensor, a temperature sensor, a humidity sensor, or an illuminance sensor. According to an embodiment, the proximity sensor 382 may detect whether the user wears the electronic device 101.

According to certain embodiments, the electronic device 101 may include key input devices 384 and 386 that may receive commands or data to be used by a component (e.g., the processor 440) of the electronic device 101, from the exterior (e.g., a user) of the electronic device 101. According to an embodiment, a first key input device 384 may be used as a key input device for controlling the volume of the speakers 376a and 376b, and a second key input device 386 may be used as a key input device for adjusting the brightness of the light output device 310.

According to certain embodiments, the electronic device 101 may include a printed circuit board 400 on which a processor (not shown) is disposed. Electronic components of the electronic device 101 may be electrically connected with the printed circuit board 400 to receive commands from the processor. For example, the first light output device 312 may be electrically connected with the printed circuit board 400 through a first flexible printed circuit board 450a, the second light output device 314 may be electrically connected with the printed circuit board 400 through a second flexible printed circuit board 450b, the 2-1st camera module 326a may be electrically connected with the printed circuit board 400 through a third flexible printed circuit board 450c, and the 2-2nd camera module 326b may be electrically connected with the printed circuit board 400 through a fourth flexible printed circuit board 450d. As another example, the first camera module 322 or the antenna module 330 may be directly electrically connected with the printed circuit board 440. As another example, the third camera module 328, the proximity sensor 382, the 3-1st light emitting unit 366a, and the 3-2nd light emitting unit 366b may be connected with the printed circuit board 400 through a fifth flexible printed circuit board 450e. According to an embodiment, the printed circuit board 400 may be electrically connected with a battery (not shown) through at least one wire (not shown). According to an embodiment, the printed circuit board 400 may be electrically connected with an auxiliary printed circuit board (not shown) through at least one wire (not shown).

According to certain embodiments, at least a portion of the printed circuit board 400 may be positioned between the first light output device 312 and the second light output device 314.

According to certain embodiments, the frame 500 may support the components of the electronic device 101. For example, at least a portion of the light output device 310, the printed circuit board 400, and/or the glass member 340 may be supported by the frame 500. The frame 500 may serve as a bracket for the light output device 310, the display panel of the light output device 310, the printed circuit board 400, and/or the glass member 340.

According to certain embodiments, the frame 500 may be formed of a material capable of increasing the dispersion of the heat generated from electronic components (e.g., the processor 440) of the electronic device 101 or reducing the heat from the electronic device 101. For example, the frame 500 may be formed of a metal. According to an embodiment, the frame 500 may be formed of at least one of aluminum, magnesium, or stainless steel.

According to certain embodiments, the frame 500 may be disposed in the housing 200 in a lengthwise direction (e.g., in a direction parallel to +Y or −Y). According to an embodiment, the frame 500 may be coupled to the second supporting member 216 of the housing 200 through a frame supporting member 510. According to an embodiment, the frame 500 may be disposed behind the printed circuit board 400 (e.g., the −X direction) and be stacked with the printed circuit board 400 to support the printed circuit board 400 as disposed between the first light output device 312 and the second light output device 314.

Figure 3:
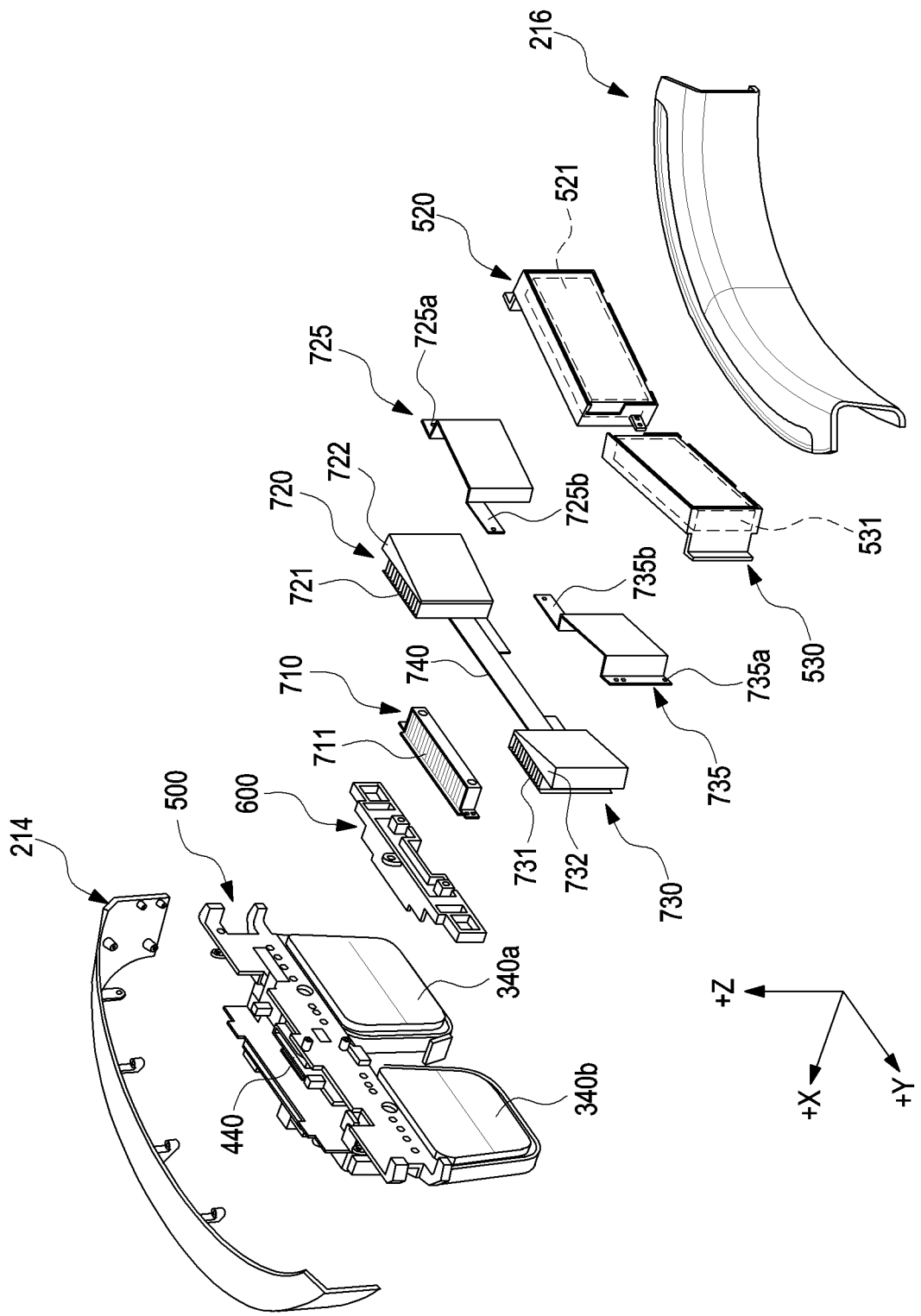
FIG. 3 is an exploded perspective of an example electronic device, showing an arrangement of a frame, a battery, and a heat radiating member according to certain embodiments of the disclosure.
Figure 4:
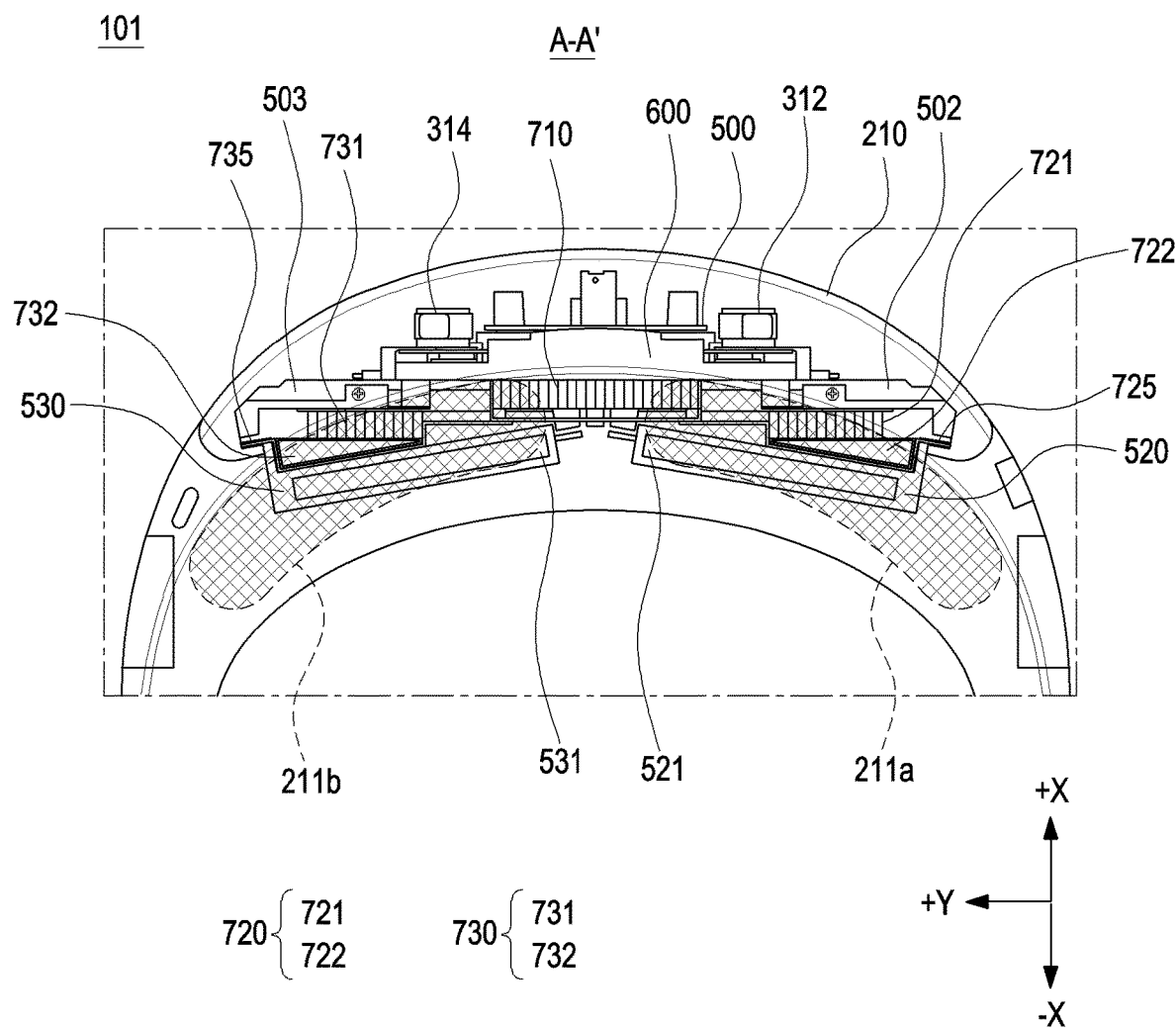
FIG. 4 is a cross-sectional view illustrating an example electronic device according to certain embodiments of the disclosure.

FIG. 3 is an exploded perspective of an electronic device 101, showing an arrangement of a frame, a battery, and a heat radiating member according to certain embodiments of the disclosure. FIG. 4 is a cross-sectional view illustrating an electronic device 101 according to certain embodiments of the disclosure. For example, FIG. 4 may show a cross-section taken along line A-A' of the electronic device 101 of FIG. 1.

According to certain embodiments of the disclosure, there may be included batteries 521 and 531 for supplying power to electronic components (e.g., a processor) of the electronic device 101. The batteries 521 and 531 may be disposed in the face-mounting part 210 of the housing 200. The batteries 521 and 531 may be surrounded by a metal case (or pouch). According to an embodiment, the batteries 521 and 531 may be spaced apart from the printed circuit board 400 by a predetermined distance, on which electronic components generating more heat than the other components of the electronic device 101 are disposed, in the face-mounting part 210 of the housing 200. According to another embodiment, the batteries 521 and 531 may be spaced apart by a predetermined distance, in the second direction (e.g., the −X direction), from the frame 500 supporting the printed circuit board 400 in the face-mounting part 210 of the housing 200. For example, as illustrated in FIG. 3, the batteries 521 and 531 may be disposed between the printed circuit board 400 and/or the frame 500 and the second surface 200b (or the second supporting member 216) of the housing 200. As another example, as illustrated in FIG. 3, the batteries 521 and 531 may be tilted with respect to an axis of the printed circuit board 400 and/or the frame 500. As the batteries 521 and 531 are spaced apart by a predetermined distance from, and tilted with respect to, the printed circuit board 400 and/or the frame 500, the batteries 521 and 531 may be better protected from heat.

According to certain embodiments of the disclosure, the electronic device 101 may include a heat radiating structure for transferring, dispersing, and radiating the heat generated from electronic components (e.g., the processor and the light output device). According to certain embodiments, the electronic device 101 may include first heat radiating members 720 and 730 disposed in the spaces between the frame 500 and the batteries 521 and 531. Further, according to an embodiment, the electronic device 101 may include a second heat radiating member 600 disposed in a space adjacent to the frame 500, as another component of the heat radiating structure configured separately from the first heat radiating members 720 and 730.

According to an embodiment, the batteries 521 and 531 may be disposed along the shape of the second surface 200*b* of the housing 200 so as to be spaced away from heat generating electronic components (e.g., the processor and/or the light output device) and/or the printed circuit board 400. According to an embodiment, as illustrated in FIGS. 3 and 4, the batteries 521 and 531 may be tilted (or oblique) with respect to an plane defined by the frame 500. According to an embodiment, the frame 500 may extend along a lengthwise direction the electronic device 101 and be positioned in a center of the housing 200. In contrast, since the batteries 521 and 531 are disposed adjacent to the second supporting member 216 in the housing 200 of the electronic device 101, spaces may be defined between the frame 500 and the batteries 521 and 531. If the batteries 521 and 531 are disposed oblique from the frame 500, the predetermined spaces between the frame 500 and the batteries 521 and 531 may be formed to be oblique with respect to the frame 500. According to certain embodiments of the disclosure, the first heat radiating members 720 and 730 may be disposed in the oblique spaces.

According to certain embodiments, the first heat radiating members 720 and 730 may include first heat radiating pins 721 and 731. The first heat radiating pins 721 and 731 may include a plurality of pins formed in a third direction (e.g., the +Z direction) perpendicular to the first direction (e.g., the +X direction) and the second direction (e.g., the −X direction). According to certain embodiments, the first heat radiating pins 721 and 731 may include a metal fin shape arranged in a multi-barrier structure. According to an embodiment, the first heat radiating pins 721 and 731 may be formed in a narrow flat shape having a lengthwise dimension aligning to the vertical orientation of the electronic device 101 (e.g., + and −Z as in FIG. 3).

According to an embodiment, the first heat radiating pins 721 and 731 may have through holes to allow external air to flow in the third direction. The first heat radiating pins 721 and 731 may be formed of a metal or a metal alloy for effectively transferring, dispersing, and radiating the heat generated from a heat source (e.g., an electronic component and/or a light output device) in the electronic device 101. For example, the first heat radiating pins 721 and 731 may include a material, such as aluminum, magnesium, or stainless steel.

According to certain embodiments, the first radiating members 720 and 730 may include channels 722 and 732 defining through holes that include a triangular or quadrangular cross section which may allow the air to flow in the third direction perpendicular to the first direction (e.g., the +X direction) and the second direction (e.g., the −X direction). The channels 722 and 732 may have a larger cross-sectional area in through hole than the first heat radiating pins 721 and 731. The channels 722 and 732 are not limited to having a specific cross-sectional shape or size, as long as the cross sections have a triangular or quadrangular shape. The cross-sectional shape of the channels 722 and 732 may be selected according to the shape and arrangement of the batteries 521 and 531. For example, if the batteries 521 and 531 are inclined with respect to the frame 500 as illustrated in FIG. 3, the spaces between the batteries 521 and 531 and the frame 500 will be formed obliquely, so that the channels of the first heat radiating members 720 and 730 may benefit from a triangular shape. According to certain embodiments, although not illustrated in the drawings, the channels 722 and 732 may also be formed with at least one barrier as are the first heat radiating pins 721 and 731. However, for channels with a triangular cross section, formation of barriers may not be easy or manufacturing costs may increase in the manufacturing process. This may also be true for channels having a cross section shaped as a trapezoid, not a rectangle. According to certain embodiments of the disclosure, a dual structure of the first heat radiating pins 721 and 731 and the channels 722 and 732 is provided as heat radiating means. The first heat radiating pins 721 and 731 may include a rectangular cross section for which barriers may be more readily formed in the manufacturing process. The first heat radiating pins 721 and 731 may be formed with a plurality of through holes, and the channels 722 and 732, which have a quadrangular cross section, neither triangular nor rectangular, may be formed with a minimum number of through holes, thereby reducing manufacturing costs According to certain embodiments, the first heat radiating pins 721 and 731 and the channels 722 and 732 may be joined together substantially into a single component by various joining means, such as welding or bonding.

According to certain embodiments, the first heat radiating members 720 and 730 may be provided as a pair of first heat radiating members 720 and 730. The pair of first heat radiating members 720 and 730 may be arranged in positions corresponding to the pair of light output devices 312 and 314 of the frame 500. For example, the frame 500 may include display panel brackets for the pair of light output devices 312 and 314, and first surfaces (or first surfaces of the first heat radiating pins) of the pair of first heat radiating members 720 and 730 may be disposed so as to face the display panel brackets of the pair of light output devices 312 and 314. In another example, second surfaces (or second surfaces of the channels 722 and 732) of the pair of first heat radiating members 720 and 730 may be disposed to face first surfaces of the battery housings 520 and 530.

According to certain embodiments, the electronic device 101 may further include heat radiating plates 725 and 735 coupled to first sides of the channels 722 and 732. The heat radiating plates 725 and 735 may be formed in shapes corresponding to the external shapes of the channels 722 and 732. For example, the heat radiating plates 725 and 735 may include cross sectional structures corresponding to triangular or quadrangular cross sectional structures, and may at least partially surround the channels 722 and 732 by the cross sectional structures. First fastening pieces 725*a* and 735*a* may be provided for stably fixing the channels 722 and 732 to the battery housings 520 and 530, and may be formed on first sides of the heat radiating plates 725 and 735, and second fastening pieces 725*b* and 735*b* for connection with the second heat radiating pin 710 may be formed which are described below in detail. At least one fastening hole may be formed in the first fastening pieces 725*a* and 735*a* and the second fastening pieces 725*b* and 735*b*. The heat radiating plates 725 and 735 may be coupled with the battery housings 520 and 530 and/or the second heat radiating pin 710 using a fastening mean, such as a bolt or rivet, which may be inserted into the fastening hole. According to an embodiment, the heat radiating plates 725 and 735 may be formed of stainless steel having high rigidity and good thermal conduction efficiency.

According to certain embodiments, the pair of first heat radiating members 720 and 730 may be spaced apart from each other by a predetermined distance in a lengthwise direction (e.g., the +Y direction or the −Y direction) of the electronic device 101. Further, the electronic device 101 of the disclosure may further include a connection member 740 connecting the pair of first heat radiating members 720 and 730. The connection member 740 may facilitate heat transfer between the pair of first heat radiating members 720 and 730 and may include, for example, a heat pipe. When one of the pair of first heat radiating members 720 and 730 has a relatively high temperature and the other heat radiating member has a relatively low temperature, the dispersion of heat soak in the electronic device 101 may be increased by transferring the heat from a high temperature to a low temperature area.

According to certain embodiments, an external air inlet hole (e.g., the external air inlet hole 211 of FIG. 1) for radiating heat may be formed in a side surface 200c of the housing 200 in the electronic device 101. According to an embodiment, the external air inlet hole 211 may be formed in a position corresponding to the first heat radiating members 720 and 730. The shape or position of the external air inlet hole 211 may vary. For example, an integrated external air inlet hole corresponding to the shape of the housing 200 of the electronic device 101 may be formed as illustrated in FIG. 1, or a plurality of external air inlet holes 211a and 211b may be formed, each corresponding to the positions of the first heat radiating members 720 and 730 as illustrated in FIG. 4. According to certain embodiments, the electronic device 101 may further include a dustproof/waterproof seal disposed in a position corresponding to the external air inlet holes 211a and 211b.

According to certain embodiments of the disclosure, it is possible to reduce the empty space in the mounting space by disposing the first heat radiating members 720 and 730 in the spaces formed by spacing the frame 500 away from the batteries 521 and 531. It is also possible to improve the heat radiation effect by including the first heat radiating pins 721 and 731 and the channels 722 and 732 in the first heat radiating members 720 and 730, as disposed in the spaces, according to certain embodiments.

Figure 5:
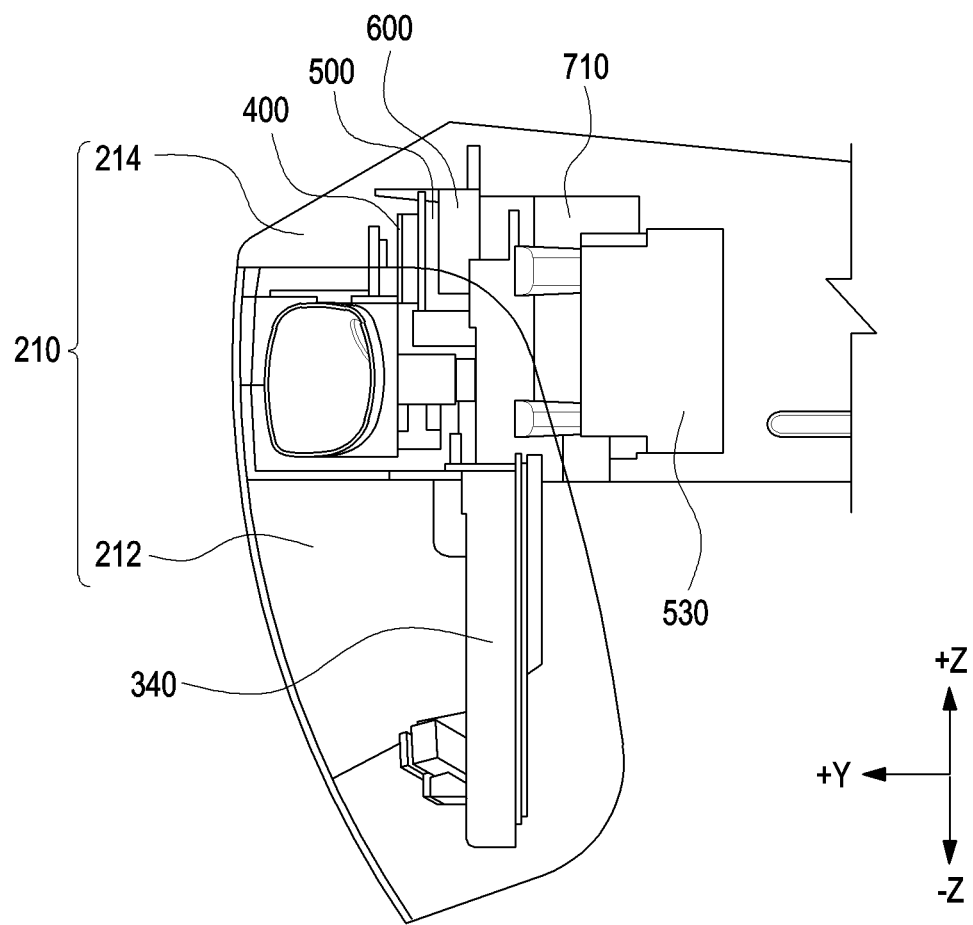
FIG. 5 is a side cross-sectional view illustrating an example electronic device according to certain embodiments of the disclosure.

FIG. 5 is a side cross-sectional view illustrating an electronic device according to certain embodiments of the disclosure.

A second heat radiating member 600 may be further include to transfer, disperse, and radiate the heat in the electronic device 101, in addition to, or as an alternative to, the first heat radiating members 720 and 730.

Referring to FIGS. 4 and 5, the second heat radiating member 600 may be disposed adjacent to the frame 500 in the third direction (e.g., +Z direction) perpendicular to the first direction (e.g., the +X direction) and the second direction (e.g., the −X direction). According to an embodiment, the second heat radiating member 600 may at least partially contact the printed circuit board 400 and the frame 500. As another example, the second heat radiating member 600 may be disposed around the first supporting member 214, of the first supporting member 214 and the window member 212 of the housing 200, so as to radiate, in the third direction, the heat generated from various electronic components disposed on the printed circuit board 400 (e.g., the processor).

The electronic device 101 may radiate the heat generated from the electronic component (e.g., the processor and/or the light output device) through the first heat radiating members 720 and 730 connected to the rear surface of the frame 500, and radiate the heat generated from the electronic components (e.g., the processor and/or the light output device) through the second heat radiating member 600 connected to the side surface of the frame 500. As such, discomfort caused by heat soak in the electronic device may be reduced, by diversifying heat radiation routes within the housing 200 of the electronic device 101.

Figure 6:
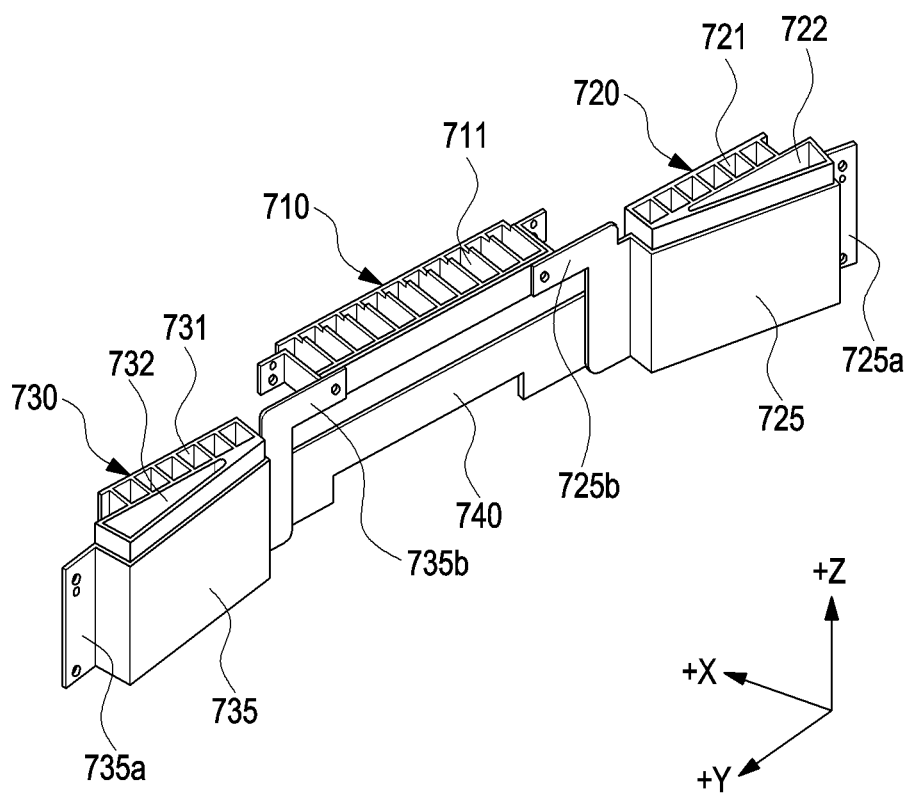
FIG. 6 is a view illustrating a portion of an example heat radiating structure according to certain embodiments of the disclosure.

FIG. 6 is a view illustrating a portion of a heat radiating structure according to certain embodiments of the disclosure.

According to certain embodiments of the disclosure, the electronic device 101 may further include a second heat radiating pin 710.

Referring to FIGS. 3 to 6, the second heat radiating pin 710 may be disposed in contact with the second heat radiating member 600 and transfer the heat from the second heat radiating member 600 in the second direction (e.g., the −Y direction). The second heat radiating pin 710 may transfer the heat from the second heat radiating member 600 to the first heat radiating members 720 and 730 in the second direction (e.g., the −Y direction). In other words, the second heat radiating member 600 may be thermally connected with the first heat radiating members 720 and 730 via the second heat radiating pin 710.

According to certain embodiments, the second heat radiating pin 710 may include metal fin shapes formed in a multi-barrier structure 711. According to an embodiment, the second heat radiating pin 710 may extend along the lengthwise direction of the electronic device 101. The second heat radiating pin 710 may be relatively flat along its length, and contact with the rear surface of the second heat radiating member 600.

The second heat radiating pin 710 may be formed of a metal or a metal alloy for effectively transferring, dispersing, and radiating the heat generated from a heat source (e.g., an electronic component and/or a light output device) in the electronic device 101. For example, the second heat radiating pin 710 may be formed using a material, such as aluminum, magnesium, or stainless steel, like the first heat radiating members 721 and 731.

Referring to FIG. 6, the first heat radiating members 720 and 730 may be disposed on the left and right sides of the connection member 740, which is disposed lengthwise along the lengthwise direction of the electronic device (e.g., the electronic device 101 of FIG. 1), in the electronic device 101. Although not shown in the drawings, the second heat radiating member 600 may be disposed on the front surface of the second heat radiating pin 710 and, as viewed from the connection member 740, the second heat radiating member 600 may be disposed in the upper center of the electronic device 101. As illustrated in FIG. 6, the heat radiating structure according to certain embodiments of the disclosure may include heat radiating members on left/right sides and in a center inside the housing 200 of the electronic device 101. As such, according to certain embodiments of the disclosure, the heat radiating structure may provide means to efficiently transfer, disperse, and radiate the heat generated in the face-mounting part 210 and maximize heat radiation efficiency via contact between the heat radiating structure and the airflow from an exterior by a through hole, through which the air enters to flow around the heat radiating structure.

Figure 7:
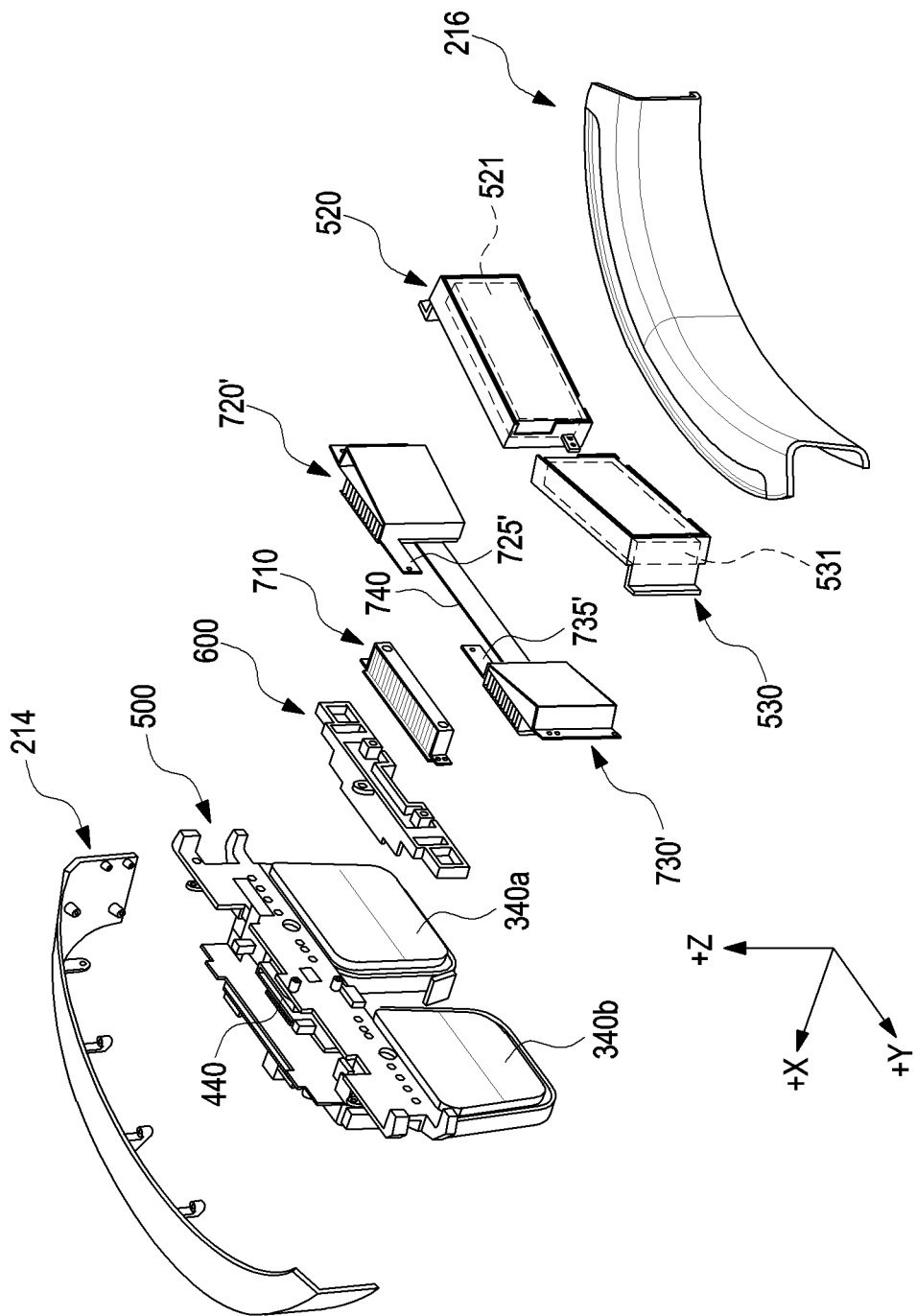
FIG. 7 is an exploded perspective of an example electronic device, showing an arrangement of a frame, a battery, and a heat radiating member, according to an embodiment different from FIG. 3.

FIG. 7 is an exploded perspective of an electronic device, showing an arrangement of a frame, a battery, and a heat radiating member, according to an embodiment different from FIG. 3.

For the sake of brevity, no repetitive, duplicate description is presented below of those components already described above in connection with FIG. 3.

Referring to FIG. 7, according to certain embodiments of the disclosure, first heat radiating members 720' and 730' are formed so that heat radiating plates (e.g., the heat radiating plates 725 and 735 of FIG. 6) may be integrated with the channels on first sides thereof. For example, rather than providing separate heat radiating plates, the channels are formed to function as heat radiating plates (e.g., transferring heat and/or fastening components). To that end, the channels of the first heat radiating members 720' and 730' may include fastening pieces 725' and 735' that are stably fastened with the battery housings 520 and 530, or connected with the second heat radiating pin 710. In other words, as illustrated in FIG. 7, the first heat radiating members 720' and 730' may be shaped so that the first heat radiating pin, channel, and heat radiating plate are integrated together.

Figure 8:
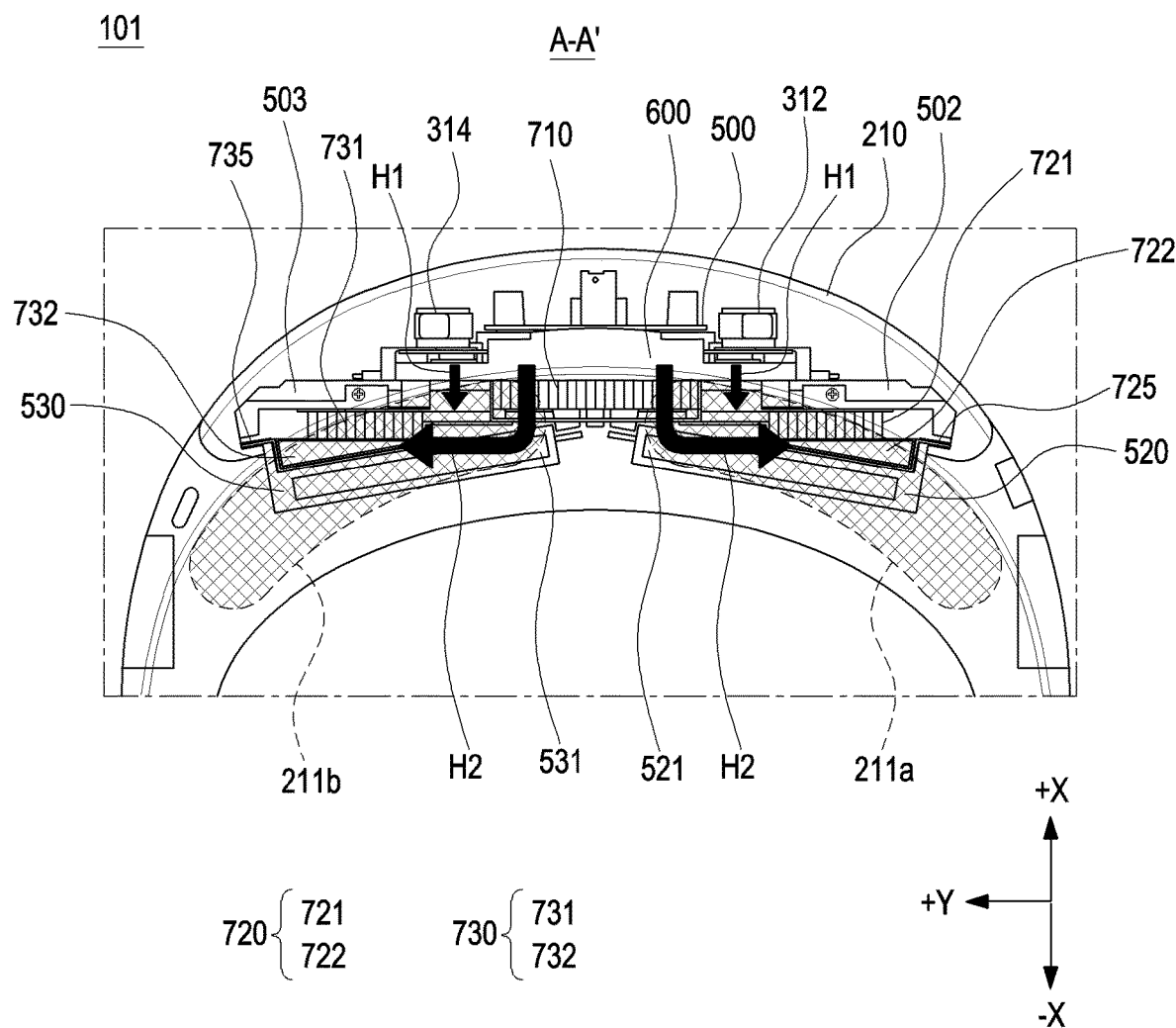
FIG. 8 is a cross-sectional view illustrating an example heat transfer path in an electronic device according to certain embodiments of the disclosure.

FIG. 8 is a cross-sectional view illustrating a heat transfer path in an electronic device according to certain embodiments of the disclosure. FIG. 8 is a side cross-sectional view illustrating a heat transfer path in an electronic device according to certain embodiments of the disclosure.

According to certain embodiments of the disclosure, the electronic device may effectively disperse the heat generated from a heat generation source using a frame receiving heat generated from electronic components (e.g., the processor and the light output device).

As a heat radiating structure, the electronic device may include first heat radiating members 720 and 730, a second heat radiating member 600, and a second heat radiating pin 710. By using the heat radiating structure, the electronic device may form first heat radiating paths H1 for dispersing the heat generated from the light output devices (e.g., the first light output device 312 and the second light output device 314) and second heat radiating paths H2 for dispersing the heat generated from electronic components of the printed circuit board 400 as illustrated in FIG. 8. Along the second heat radiating paths H2, the heat generated from the electronic components on the printed circuit board 400 may be radiated through the second heat radiating pin 710 and the first heat radiating members 720 and 730.

Figure 9:
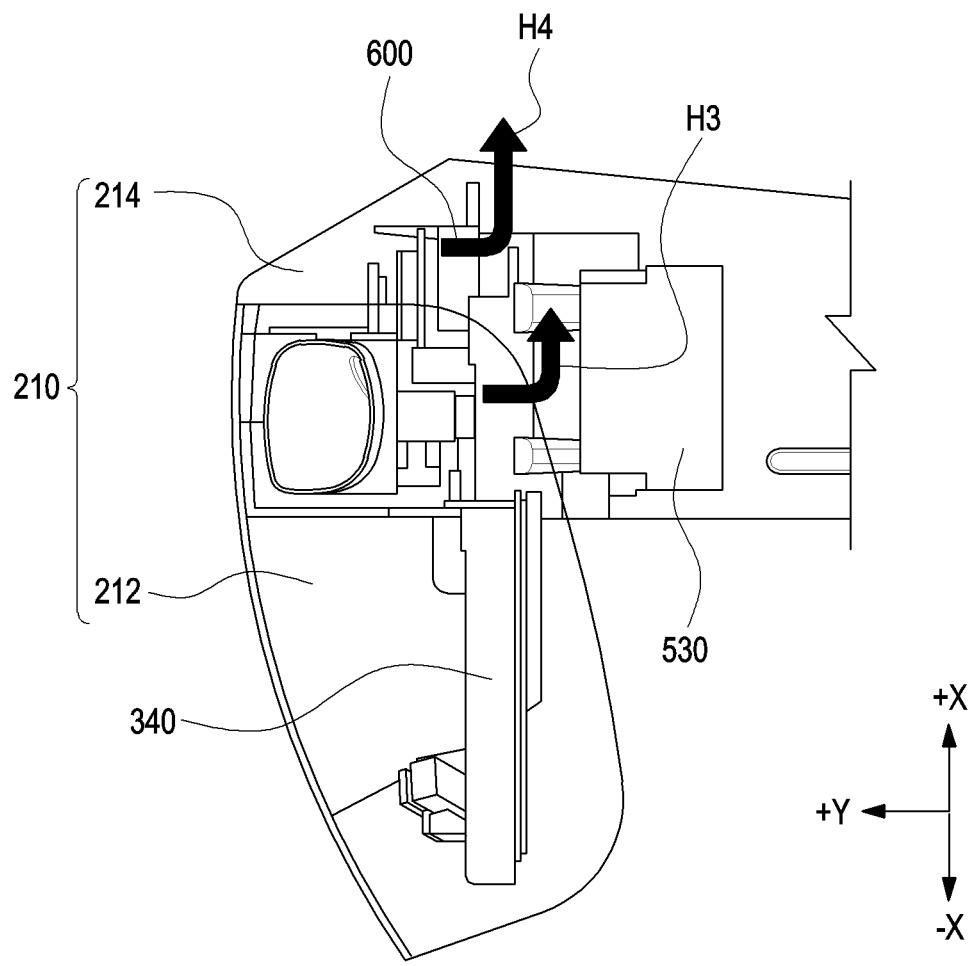
FIG. 9 is a side cross-sectional view illustrating an example heat transfer path in an electronic device according to certain embodiments of the disclosure.

Referring to FIG. 9, the electronic device may form third heat radiating paths H3 for dispersing the heat generated from the light output devices and/or electronic components. The third heat radiating paths H3 may be identical to the first heat radiating paths H1 and/or the second heat radiating paths H2. According to certain embodiments of the disclosure, the electronic device may form fourth heat radiating paths H4 for dispersing heat through an upper heat radiating structure (e.g., the second heat radiating member 600) of the electronic device.

As described above, according to certain embodiments of the disclosure, the electronic device provides a heat radiating structure capable of efficiently transferring, dispersing, and radiating the heat generated in the face-mounting part, thereby forming various heat radiating paths and maximizing the heat radiation efficiency.

Figure 10:
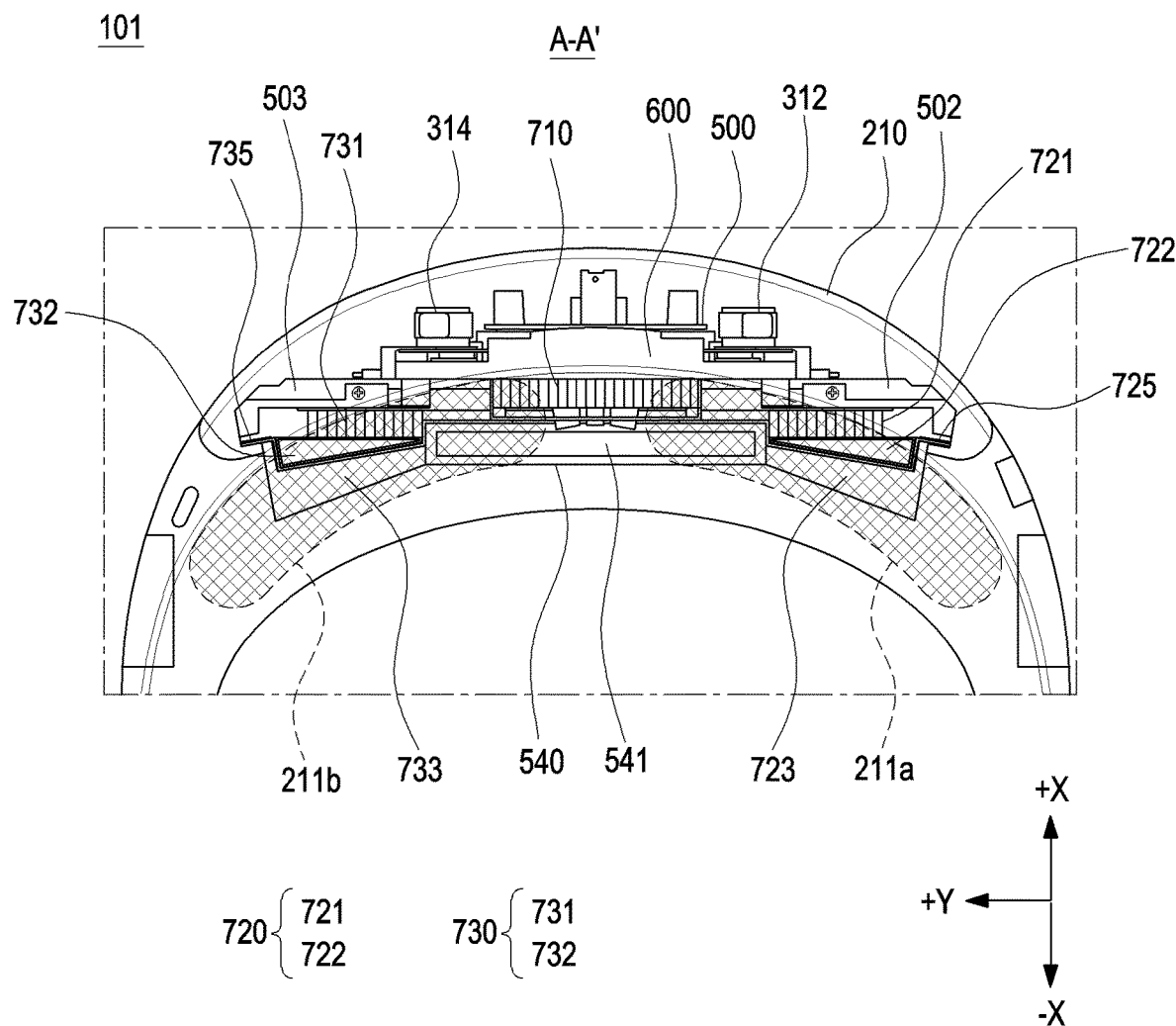
FIG. 10 is a cross-sectional view illustrating an example electronic device according to an embodiment different from FIG. 4.

FIG. 10 is a cross-sectional view illustrating an electronic device according to an embodiment different from FIG. 4.

For the sake of brevity, no repetitive, duplicate description is presented below for components already described above in connection with FIG. 4.

According to certain embodiments of the disclosure, the electronic device 101 may utilize a single battery in the face-mounting part 210 as illustrated in FIG. 8, rather than the pair of batteries disposed inclined with respect to the frame 500 as illustrated in FIG. 3.

In the embodiment of FIG. 10, the battery 541 and the housing 540 enclosing the battery 541 may be disposed in the center of the face-mounting part 210 to improve the weight balance of the electronic device 101. Accordingly, the battery 541 may be disposed in parallel with the frame 500.

In the embodiment of FIG. 10, the electronic device 101 may include a heat radiating structure, including a first heat radiating members 720 and 730 and a second heat radiating member 600.

The components including the first heat radiating members 720 and 730 may be formed in a shape corresponding to the placement of the battery 541. For example, the first heat radiating members 720 and 730 may include second channels 723 and 733 in addition to the first channels 722 and 732. As the battery 541 is positioned in the center of the face-mounting part 210 (as in FIG. 9), open spaces may be formed on the left and right sides of the battery housing 540. The second channels 723 and 733 may further be formed in the open spaces. By further forming the second channels 723 and 733, it is possible to expand the external air inlet paths corresponding to the external air inlet holes 211a and 211b formed in the surface of the housing 200, in the embodiment of FIG. 8, as compared with the embodiment of FIG. 4.

According to certain embodiments, the channels of the first heat radiating members 720 and 730 include two channels 722 and 723 (732 and 733) separated by the barrier structure as illustrated in FIG. 8 but are not necessarily limited thereto. According to an embodiment, three or more channels may be formed by including two or more barrier structures. According to an embodiment, it is possible to form a single channel with a single quadrangular through hole without a barrier structure.

According to certain embodiments of the disclosure, an electronic device (e.g., the electronic device 101 of FIG. 1) comprises a housing (e.g., the housing 200 of FIG. 1) including a first surface (e.g., the first surface 200a of FIG. 1) facing in a first direction (e.g., the +X direction of FIG. 1), which is a direction of a user's gaze, when the user wears the electronic device, a second surface (e.g., the second surface 200b of FIG. 1) facing in a second direction opposite to the first direction and facing the user's face, and a side surface surrounding a space between the first surface and the second surface, a first light output device (e.g., the first light output device 312 of FIG. 2) and a second light output device (e.g., the second light output device 314 of FIG. 2) disposed in the housing and configured to output an image, a printed circuit board (e.g., the printed circuit board 400 of FIG. 2) at least partially positioned between the first light output device and the second light output device and including at least one electronic component, a frame (e.g., the frame 500 of FIG. 2) supporting at least one of the first light output device, the second light output device, and the printed circuit board, a battery (e.g., the batteries 521 and 531 of FIG. 3) disposed between the frame and the second surface, and a first heat radiating member (e.g., the first heat radiating members 720 and 730 of FIG. 3) disposed between the frame and the battery.

According to certain embodiments, the battery may be spaced apart from the frame in the second direction.

According to certain embodiments, the battery may be disposed to be inclined with respect to the frame.

According to certain embodiments, an external air inlet hole (e.g., the external air inlet hole 211 of FIG. 1) may be formed in the side surface of the housing to radiate heat.

According to certain embodiments, the external air inlet hole may be formed in a position corresponding to the first heat radiating member.

According to certain embodiments, the first heat radiating member may include a first heat radiating pin (e.g., the first heat radiating pins 721 and 731 of FIG. 3) formed with a plurality of pins in a third direction perpendicular to the first direction and the second direction.

According to certain embodiments, the first heat radiating member may include a channel (e.g., the channels 722 and 732 of FIG. 3) having a triangular or quadrangular cross section and formed with a through hole, through which external air may flow, in a third direction perpendicular to the first direction and the second direction.

According to certain embodiments, at least a surface of the channel may be formed to face the battery inclined with respect to the frame.

According to certain embodiments, the first heat radiating member may include a pair of first heat radiating members symmetrically formed on a left and right side of a virtual line connecting a center of the housing.

According to certain embodiments, the electronic device may further comprise a connection member (e.g., the connection member 730 of FIG. 3) connecting the pair of first heat radiating members to each other.

According to certain embodiments, the pair of first heat radiating members may be disposed on a rear surface of the frame where the first light output device and the second light output device are mounted.

According to certain embodiments, the electronic device may further comprise a second heat radiating member (e.g., the second heat radiating member 600 of FIG. 3) configured to transfer at least a portion of heat generated from the electronic component to the first heat radiating member.

According to certain embodiments, the second heat radiating member may be disposed adjacent to the frame in a third direction (e.g., the +Z direction of FIG. 3) perpendicular to the first direction and the second direction.

According to certain embodiments, the electronic device may further comprise a second heat radiating pin (e.g., the second heat radiating pin 710 of FIG. 3) disposed in contact with the second heat radiating member and configured to transfer heat from the second heat radiating member in the second direction.

According to certain embodiments, the second heat radiating member may be connected with the first heat radiating member using the second heat radiating pin.

According to certain embodiments of the disclosure, an electronic device (e.g., the electronic device 101 of FIG. 1) comprises a housing (e.g., the housing 200 of FIG. 1) including a first surface (e.g., the first surface 200a of FIG. 1) facing in a first direction (e.g., the +X direction of FIG. 1), which is a direction of a user's gaze, when the user wears the electronic device, a second surface (e.g., the second surface 200b of FIG. 1) facing in a second direction opposite to the first direction and facing the user's face, and a side surface surrounding a space between the first surface and the second surface, a first light output device (e.g., the first light output device 312 of FIG. 2) and a second light output device (e.g., the second light output device 314 of FIG. 2) disposed in the housing and configured to output an image, a printed circuit board (e.g., the printed circuit board 400 of FIG. 2) at least partially positioned between the first light output device and the second light output device and including at least one electronic component, a frame (e.g., the frame 500 of FIG. 2) supporting at least one of the first light output device, the second light output device, and the printed circuit board, a pair of batteries (e.g., the batteries 521 and 531 of FIG. 3) disposed to be inclined with respect to the frame between the frame and the second surface, a pair of first heat radiating members (e.g., the first heat radiating members 720 and 730 of FIG. 3) disposed between the frame and the batteries, and a second heat radiating member (e.g., the second heat radiating member 600 of FIG. 3) disposed adjacent to the frame in a third direction (e.g., +Z direction) perpendicular to the first direction and the second direction.

According to certain embodiments, the pair of first heat radiating members may include a pair of first heat radiating pins formed with a plurality of pins in a third direction perpendicular to the first direction and the second direction.

According to certain embodiments, the pair of first heat radiating member may include a pair of channels having a triangular or quadrangular cross section and formed with a through hole, through which external air may flow, in a third direction perpendicular to the first direction and the second direction.

According to certain embodiments, the electronic device may further comprise a second heat radiating pin disposed in contact with the second heat radiating member and configured to transfer heat from the second heat radiating member in the second direction.

According to certain embodiments, the electronic device may further comprise a connection member connecting the pair of first heat radiating members to each other.

It is apparent to one of ordinary skill in the art that an electronic device including heat radiating members as described above are not limited to the above-described embodiments and those shown in the drawings, and various changes, modifications, or alterations may be made thereto without departing from the scope of the present disclosure.

What is claimed is:

1. An electronic device, comprising:
   a housing including a first surface facing a first direction corresponding to a gaze of a user when wearing the electronic device, a second surface configured to be worn facing a forehead of the user and opposite the first surface, and a side surface surrounding a space defined between the first surface and the second surface;
   a first light output device and a second light output device disposed in the housing and configured to output an image;
   a printed circuit board at least partially disposed between the first light output device and the second light output device, and including at least one electronic component;
   a frame supporting at least one of the first light output device, the second light output device, and the printed circuit board;
   a battery disposed between the frame and the second surface in the space defined by the first surface and the second surface;
   a first heat radiating member disposed between the frame and the battery,
   a second heat radiating member configured to transfer at least a portion of heat generated from the at least one electronic component to the first heat radiating member, and
   a second heat radiating pin contacting the second heat radiating member, configured to transfer heat from the second heat radiating member towards the second surface,
   wherein the first heat radiating member includes a plurality of first heat radiating pins, arranged in a third direction perpendicular to the first direction, and
   wherein the battery is closer to the second surface than the first heat radiating member.

2. The electronic device of claim 1, wherein the battery is spaced away from the frame towards the second surface.

3. The electronic device of claim 1, wherein the battery is disposed at an incline with respect to the frame.

4. The electronic device of claim 1, wherein an external air inlet hole is formed in the side surface of the housing to radiate heat.

5. The electronic device of claim 4, wherein the external air inlet hole is formed at a position corresponding to the first heat radiating member.

6. The electronic device of claim 1, wherein the first heat radiating member includes a channel having one of a triangular or quadrangular cross section, and formed with a through hole, through which external air flows, and
wherein the channel is oriented in the third direction perpendicular to the first direction.

7. The electronic device of claim 6, wherein at least one surface of the channel is oriented facing the battery that is inclined with respect to the frame.

8. The electronic device of claim 1, wherein the first heat radiating member includes a pair of heat radiating members, and
wherein the pair of heat radiating members are symmetrically disposed on a left and right side of a virtual line connecting a center of the housing.

9. The electronic device of claim 8, further comprising a connection member operably connecting the pair of heat radiating members to each other.

10. The electronic device of claim 8, wherein the pair of heat radiating members are disposed on a rear surface of the frame at a location where the first light output device and the second light output device are mounted.

11. The electronic device of claim 1, wherein the second heat radiating member is disposed adjacent to the frame in the third direction perpendicular to the first direction.

12. The electronic device of claim 1, wherein the second heat radiating member is connected with the first heat radiating member through the second heat radiating pin.

13. An electronic device, comprising:
a housing including a first surface facing a first direction corresponding to a gaze of a user when wearing the electronic device, a second surface configured to be worn facing a forehead of the user and opposite the first surface, and a side surface surrounding a space between the first surface and the second surface;
a first light output device and a second light output device disposed in the housing and configured to output an image;
a printed circuit board at least partially disposed between the first light output device and the second light output device, and including at least one electronic component;
a frame supporting at least one of the first light output device, the second light output device, and the printed circuit board;
a pair of batteries disposed to be inclined with respect to the frame between the frame and the second surface in the space defined by the first surface and the second surface;
a pair of first heat radiating members disposed between the frame and the batteries, a second heat radiating member disposed adjacent to the frame in a third direction perpendicular to the first direction, and
a second heat radiating pin disposed in contact with the second heat radiating member and configured to transfer heat from the second heat radiating member towards the second surface,
wherein the pair of first heat radiating members include a pair of first heat radiating pins formed with a plurality of pins in the third direction perpendicular to the first direction, and
wherein the pair of batteries is closer to the second surface than the pair of first heat radiating members.

14. The electronic device of claim 13, wherein the pair of first heat radiating member include a pair of channels having a triangular or quadrangular cross section and formed with a through hole, through which external air may flow, in the third direction perpendicular to the first direction.

15. The electronic device of claim 13, further including a connection member connecting the pair of first heat radiating members to each other.

* * * * *